(12) United States Patent
Olson et al.

(10) Patent No.: US 7,745,910 B1
(45) Date of Patent: Jun. 29, 2010

(54) SEMICONDUCTOR DEVICE HAVING RF SHIELDING AND METHOD THEREFOR

(75) Inventors: Timothy L. Olson, Phoenix, AZ (US); Christopher M. Scanlan, Chandler, AZ (US); Christopher J. Berry, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 390 days.

(21) Appl. No.: 11/775,492

(22) Filed: Jul. 10, 2007

(51) Int. Cl.
*H01L 23/552* (2006.01)

(52) U.S. Cl. .............. 257/659; 257/660; 257/E23.114; 257/E23.115

(58) Field of Classification Search .................. 257/659, 257/660, E23.114, E23.115
See application file for complete search history.

(56) References Cited

U.S. PATENT DOCUMENTS

| | | | |
|---|---|---|---|
| 4,925,024 A | 5/1990 | Ellenberger et al. | |
| 5,166,772 A | 11/1992 | Soldner et al. | |
| 5,416,358 A | 5/1995 | Ochi et al. | |
| 5,468,999 A | 11/1995 | Lin et al. | |
| 5,473,191 A | 12/1995 | Tanaka | |
| 5,557,142 A | 9/1996 | Gilmore et al. | |
| 5,614,694 A | 3/1997 | Gorenz, Jr. et al. | |
| 5,639,989 A | 6/1997 | Higgins, III | |
| 5,656,864 A | 8/1997 | Mitsue et al. | |
| 5,694,300 A * | 12/1997 | Mattei et al. | ................. 361/818 |
| 5,907,271 A | 5/1999 | Hirano et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,602,737 B2 | 8/2003 | Wu | |
| 6,686,649 B1 | 2/2004 | Mathews et al. | |
| 7,030,469 B2 | 4/2006 | Mahadevan et al. | |
| 7,109,410 B2 * | 9/2006 | Arnold et al. | ................ 174/390 |
| 7,342,303 B1 * | 3/2008 | Berry et al. | .................. 257/703 |
| 2002/0089832 A1 | 7/2002 | Huang | |
| 2003/0067757 A1 | 4/2003 | Richardson et al. | |
| 2005/0280139 A1 | 12/2005 | Zhao et al. | |
| 2007/0030661 A1 | 2/2007 | Morris et al. | |

* cited by examiner

*Primary Examiner*—Lex Malsawma
(74) *Attorney, Agent, or Firm*—Weiss & Moy, P.C.

(57) ABSTRACT

A semiconductor device has a substrate comprising at least one dielectric layer and at least one metal layer on a first surface of the substrate. A die is attached to the first surface of the substrate. A mold compound is used to encapsulate the die and partially encapsulate the first surface of the substrate. The mold compound has a protrusion proximate to the at least one metal layer. A conductive material covers the mold compound, including the protrusion, and contacts the at least one metal layer.

20 Claims, 9 Drawing Sheets

SEMICONDUCTOR DEVICE HAVING RF SHIELDING AND METHOD THEREFOR

FIELD OF THE INVENTION

This invention relates to semiconductor devices and, more specifically, to a semiconductor device having an integrated Radio Frequency (RF) shielding which is connected to an exposed metal layer, e.g., a ground plane, using a multi-step saw and laser ablating process.

BACKGROUND OF THE INVENTION

Radio Frequency (RF) shielding is required on certain semiconductor devices in order to minimize Electro-Magnetic Interference (EMI) radiation from the semiconductor device. RF shielding is further required to prevent RF radiation from external sources from interfering with operation of the semiconductor device.

RF shielding is generally accomplished in one of three ways. A first method is to attach a metal can over the component after the component is attached to the motherboard. However, shield attach on the mother board has several problems. First, shield attach can be costly and a low yielding process. External shields soldered to the motherboard further require additional board space.

An alternative to the shield attached method described above is an embedded RF shield. In an embedded shield, the metal RF shield is directly attached to the semiconductor package substrate by means of solder or a conductive adhesive. The shield may be fully embedded within the mold compound of the finished package or can be exposed after assembly. In either case, the addition of a metal shield as a component attached to the top surface of the substrate is problematic for several reasons. First, the addition of a metal shield as a component attached to the top surface of the substrate requires a significant amount of additional space on the package substrate. Second, it can be difficult to transfer mold in and around the metal shield to fully encapsulate the semiconductor package. Shield attach is also problematic due to flux creep after the shield is attached and delamination and extrusion issues.

The third method is the conventional conformal shield. In this method, all of the components are placed on the substrate and the substrate, or strip, is over-molded using unit molding, or pin gate molding where individual mold caps are defined within the strip such that upward facing, exposed pads in the substrate remain exposed after the mold operation. A conductive material is then applied to the strip such that it covers the units and also makes electrical contact to the upward facing pads. The strip is then singulated into individual units. While this technique eliminates the molding process concerns associated with the aforementioned embedded shield method, it does not eliminate the added substrate size required to form the so-called upward facing, exposed pads. Therefore, all of the existing solutions can be said to require these large contact pads on the top, or upward facing surface of the substrate.

Therefore, a need existed to provide a device and method to overcome the above problem.

SUMMARY OF THE INVENTION

A semiconductor device has a substrate comprising at least one dielectric layer and at least one metal layer on a first surface of the substrate. A die is attached to the first surface of the substrate. A mold compound is used to encapsulate the die and partially encapsulate the first surface of the substrate. The mold compound has a protrusion proximate to the at least one metal layer. A conductive material covers the mold compound, including the protrusion, and contacts the at least one metal layer.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
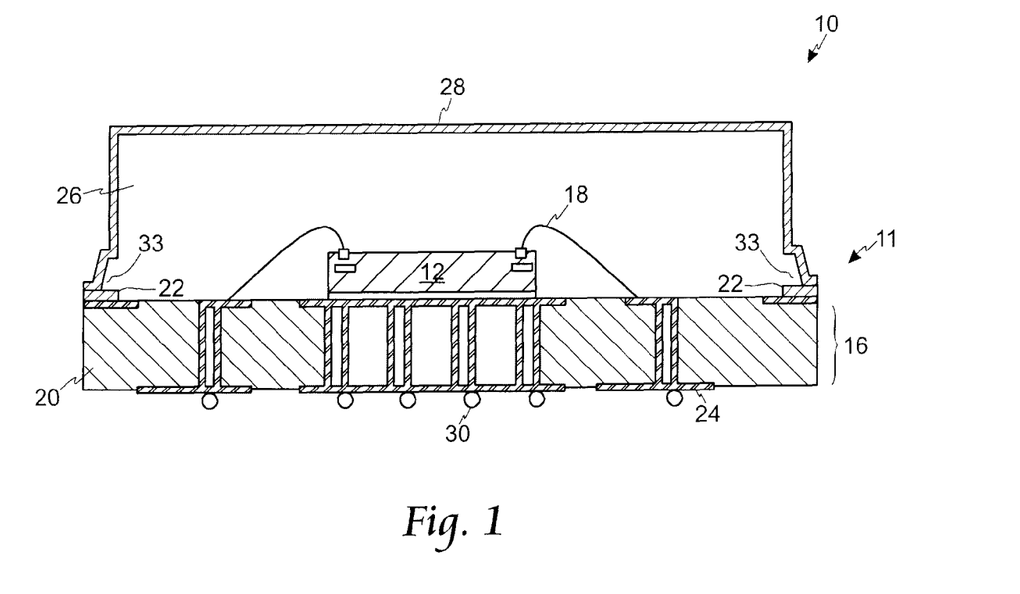
FIG. 1 is a cross-sectional view of one embodiment of the semiconductor device of the present invention.

Referring to FIG. 1, a semiconductor device 10 is shown. The semiconductor device 10 may be a lead type of device, a BGA type of device, a Land Grid Array (LGA) type of device, or the like. The listing of the above should not be seen as to limit the scope of the present invention.

The semiconductor device 10 has a die 12. The die 12 may be any type of device. For example, the die 12 may be a memory device, a logic device, an ASIC device, and other like elements. It should be noted that the listing of the above types of die 12 is given as an example and should not be seen as to limit the scope of the present invention. The die 12 is coupled to a first surface of a substrate 16. An adhesive is generally used to couple the die 12 to the substrate 16. The adhesive may be an adhesive film, an epoxy, or the like. The listing of the above adhesive types should not be seen as to limit the scope of the present invention. The die 12 is electrically coupled to the substrate 16. The die 12 may be coupled to the substrate 16 through the use of wirebonds 18. Alternatively, a flip chip may be used. It should be noted that instead of a die 12, a stacked die or multi-chip module (MCM) may be used as well as a surface mounted device (SMD).

The die 12 is placed on the first surface of the substrate 16. The substrate 16 may be any one chosen from a conventional rigid PCB, a flexible PCB, and an equivalent thereof, but the kind of substrate 16 is not limited herein. The substrate 16 includes an insulation layer 20 having predetermined area and thickness. The insulation layer 20 has an approximately planar first surface and an approximately planar second surface opposing the first surface. The substrate 16 has a plurality of metal traces 22 formed on the first surface of the insulation layer 20 and a plurality of metal traces 24 formed on the second surface thereof. While FIG. 1 shows only one layer of metal traces 22 formed on the first surface of the insulation layer 20 and one layer of metal traces 24 formed on the second surface thereof, multiple layers of metal traces 22 and 24 may be formed on either or both surfaces of the insulation layer 20. The number of metal layers is not limited to the number shown in the Figures. If multiple layers of metal traces 22 and 24 are formed, a dielectric layer is generally applied between the metal layers. The dielectric layer is used an insulating layer to separate two signal layers. A soldermask is generally placed over the top surface of the metal traces 22 and 24 formed on the substrate 16. The soldermask is used to protect the metal traces 22 and 24.

A mold compound 26 is used to encapsulate the semiconductor device 10. The mold compound 26 is mainly made of non-conductive paste or film, which is coated on the top surface of the die 12 and the exposed soldermask placed over the top surface of the last layer of metal traces 22.

As seen in FIG. 1, a side surface 11 of the semiconductor device 10 has a ledge or an "L" shape formed thereon. The side surface 11 is formed so that one of the metal traces 22 on the first surface of the insulation layer 20 is exposed. In the embodiment depicted in FIG. 1, the exposed metal trace 22 is formed on the horizontal member of the "L" shape side. All four sides of the semiconductor device 10 may be formed so that one of the metal traces 22 is exposed on each side of the semiconductor device 10.

A conductive material 28 is then applied to the semiconductor device 10. The conductive material 28 is used to provide RF shielding for the semiconductor device 10. The conductive material 28 may be applied by plating, vacuum printing, vacuum deposition, insert molding, spray coating, and the like. The conductive material 28 is applied to the top surface of the semiconductor device 10 and to the side surfaces of the semiconductor device 10. The conductive material 28 is applied so that the conductive material 28 will be in contact with the exposed metal traces 22. Thus, the semiconductor device 10 will have a conductive material 28 that contacts grounded metal. If all four sides of the semiconductor device 10 expose one of the metal traces 22, the conductive material 28 will contact ground metal on all four sides of the semiconductor device 10.

In FIG. 1, the conductive material 28 is a conformal coating. In a conformal coating, a thin layer of the conductive material 28 is applied to the top surface of the semiconductor device 10 and to the side surface of the semiconductor device 10. The conductive material 28 is applied to the side surface of the semiconductor device 10 so that the body or vertical member of the "L" shape side surface of the semiconductor device 10 and the leg or horizontal member of the "L" shape side surface of the semiconductor device 10 both have a thin layer of conductive material 28 similar in thickness to the conductive material applied to the top surface of the semiconductor device 10. In an alternative embodiment, the conductive material 28 completely covers the top surface of the semiconductor device 10 and the top surface of the substrate 16. Accordingly side surface of the conductive material 28 is substantially coplanar with the side surface of the substrate 16.

Electrical contacts 30 are coupled to a second surface of the substrate 16. The electrical contacts 30 may be a plurality of solder balls 30 as shown in FIG. 1, a plurality of leads, or the like. If solder balls 30 are used, the solder balls 30 will be electrically coupled to the second surface of the substrate 16. In general, a reflow process may be used to couple the solder balls 30 to the second surface of the substrate 16. Alternative methods may be used to couple the leads to the substrate 16 without departing from the spirit and scope of the present invention.

Figure 2:
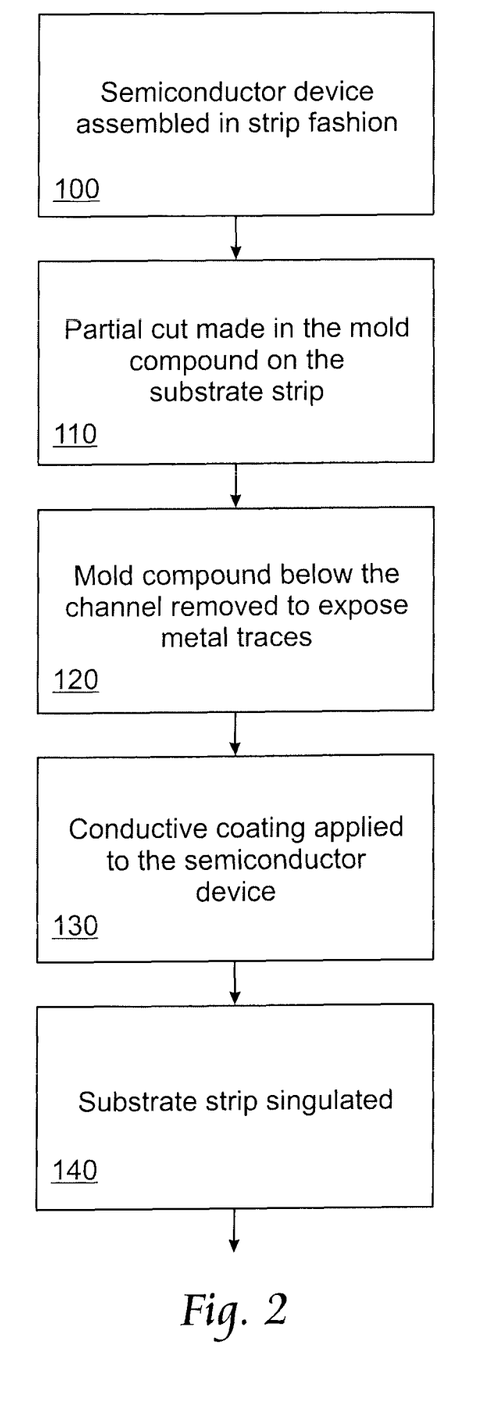
FIG. 2 is a process flow diagram depicting a method of forming the semiconductor device of FIG. 1.
Figure 3:
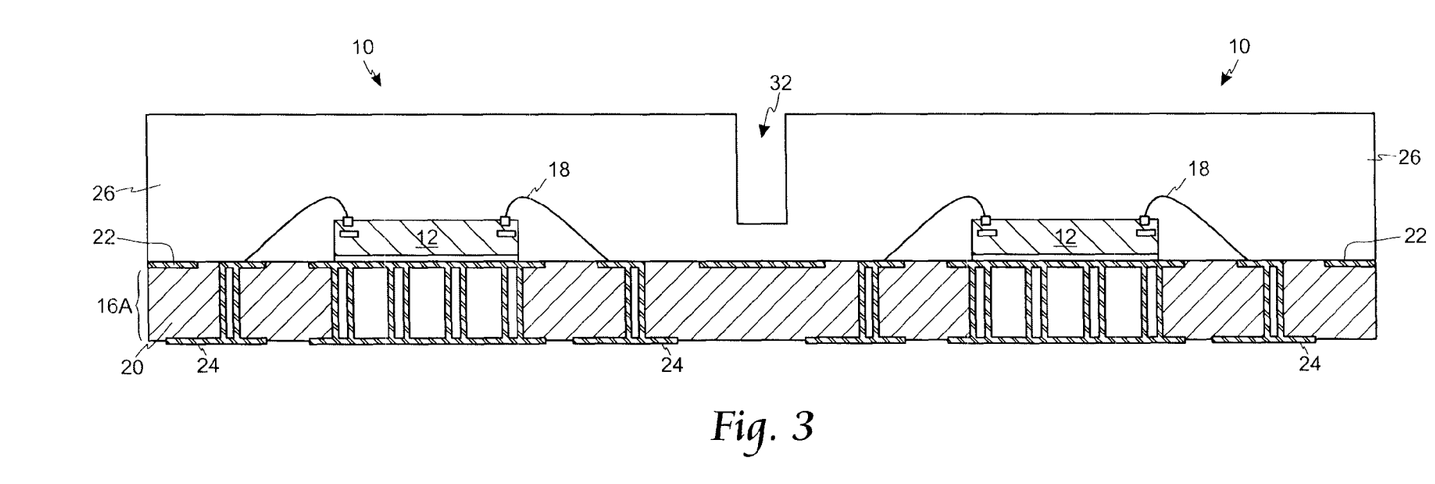
FIG. 3 is a cross-sectional view depicting a channel formed in the semiconductor device.

Referring now to FIGS. 2-8, a method of forming the semiconductor device 10 will be described. The semiconductor device 10 is assembled in strip fashion as shown in Step 100. Thus, a plurality of semiconductor devices 10 are formed from a single substrate strip 16A as shown in FIG. 3. The substrate strip 16A is segmented into a plurality of rows and columns to form individual semiconductor devices 10. While FIGS. 3-8 only shows a two dimensional view and a substrate strip 16A having only two rows, the substrate strip 16A may have a plurality of rows and columns to form individual semiconductor devices 10. The substrate strip 16A will be a fully manufactured substrate strip 16A. Each segmented section of the substrate strip 16A will include an insulation layer 20 having predetermined area and thickness. A plurality of metal traces 22 are formed on the first surface of the insulation layer 20 and a plurality of metal layers 24 formed on the second surface thereof. A soldermask may then be placed over the top surface of the last metal traces 22 and 24 formed on the substrate 16.

A die 12 is coupled to a first surface of a substrate 16 for each module on the substrate strip 16A. Some type of adhesive is generally used to couple the die 12 to the substrate 16. The die 12 is then electrically coupled to the substrate 16. The die 12 may be coupled to the substrate 16 through the use of wirebonds 18. Alternatively, a flip chip or other methods may be used.

Once each die 12 is coupled to a first surface of a substrate 16 for each module on the substrate strip 16A, a mold compound 26 is then used to encapsulate the semiconductor device 10 as shown in Step 100.

Next, as shown in Step 110, and FIG. 3, a partial cut is made in the mold compound 26 on the substrate strip 16A. The depth of the partial cut is controlled so as to only cut into a portion of the mold compound 26. The partial cut does not extend into the substrate 16. The partial cut will make a channel 32 between adjacent semiconductor devices 10. In general, all four sides of the semiconductor device 10 are cut. In accordance with one embodiment of the present invention, the thickness of the remaining mold compound 26 below the channel 32 after the partial cut is made is approximately 100μ nominal. A standard package singulation saw machine may be used to make the channel 32. However, a thicker blade is generally used. It should be noted that the channel 32 may be formed in other manners without departing from the spirit and scope of the present invention.

Figure 4:
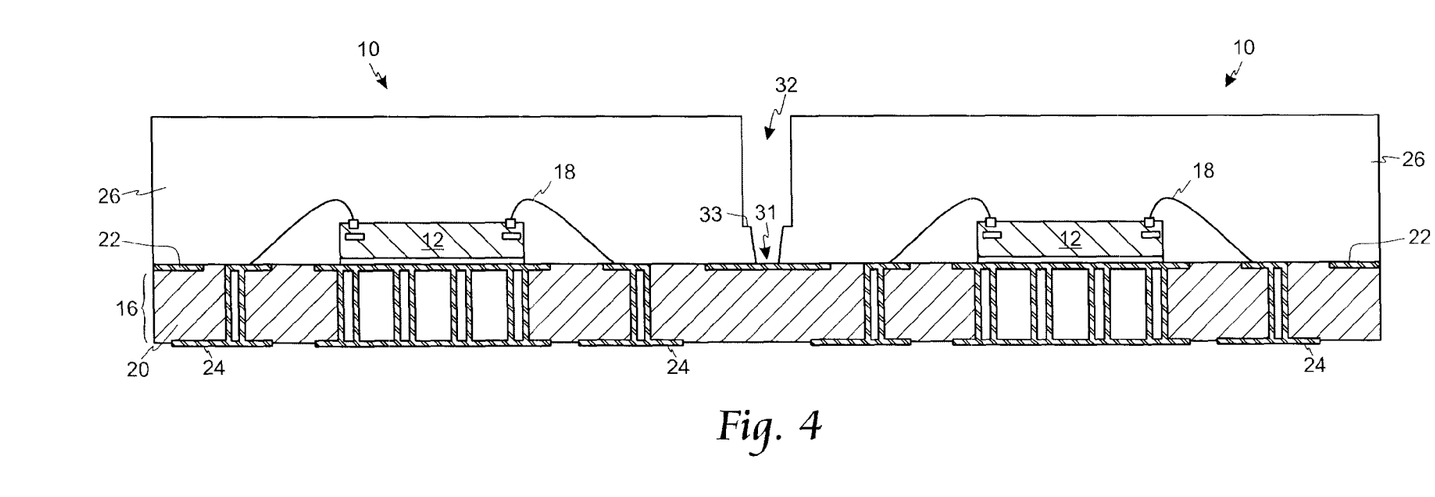
FIG. 4 is a cross-sectional view depicting removal of mold compound by laser ablation.
Figure 4A:
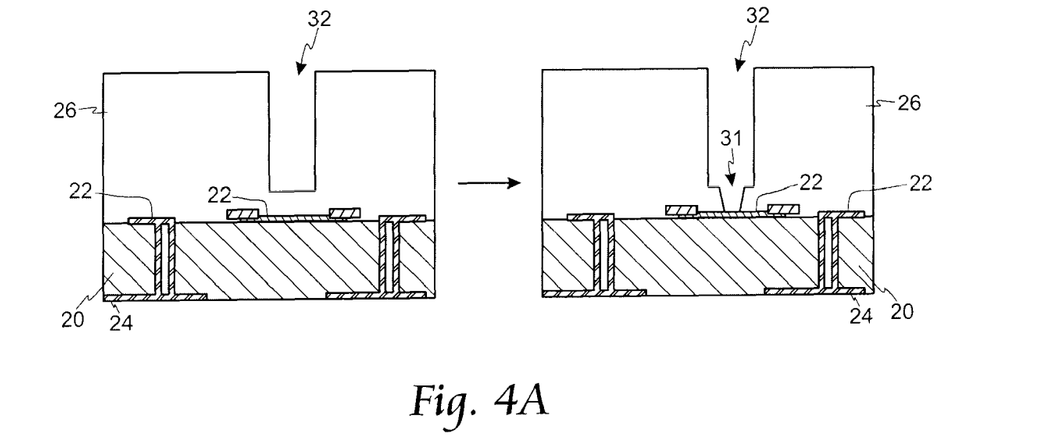
FIG. 4A is a magnified view depicting removal of mold compound by laser ablation.

In step 120, as shown in FIG. 4, an opening 31 is formed in the mold compound 26 below the channel 32 to expose the metal traces 22 formed on the first surface of the insulation layer 20. As shown in FIGS. 4 and 4A, in accordance with one embodiment of the present invention, a laser is used to selectively ablate the mold compound 26 to form the opening 31. However, a thinner blade could be used. It should be noted that the opening 31 may be formed in other manners without departing from the spirit and scope of the present invention. If a laser is used to selectively ablate the mold compound 26, the opening is tapered shape.

Figure 4B:
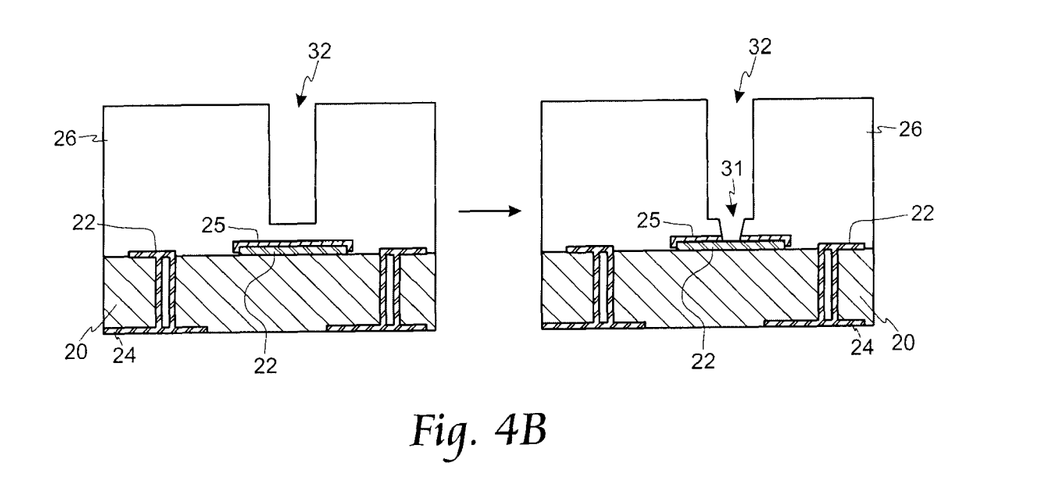
FIG. 4B is a magnified view depicting removal of mold compound and solder mask by laser ablation.

The opening 31 will generally have a smaller dimension than the channel 32. That is, the opening 31 has a tapering profile such that the opening 31 has at least two substantially differing diameters. Accordingly, the mold compound 26 has a protrusion 33 proximate to the expose metal traces 22. The laser used to form the opening 31 will expose, but not cut into, the metal traces 22 on the first surface of the insulation layer 20 independent of the depth of the mold compound 26. As shown in FIG. 4B, if a soldermask 25 is applied on the metal traces 22, the laser will form the opening 31 by selectively ablating the mold compound 26 and the soldermask 25.

Figure 7:
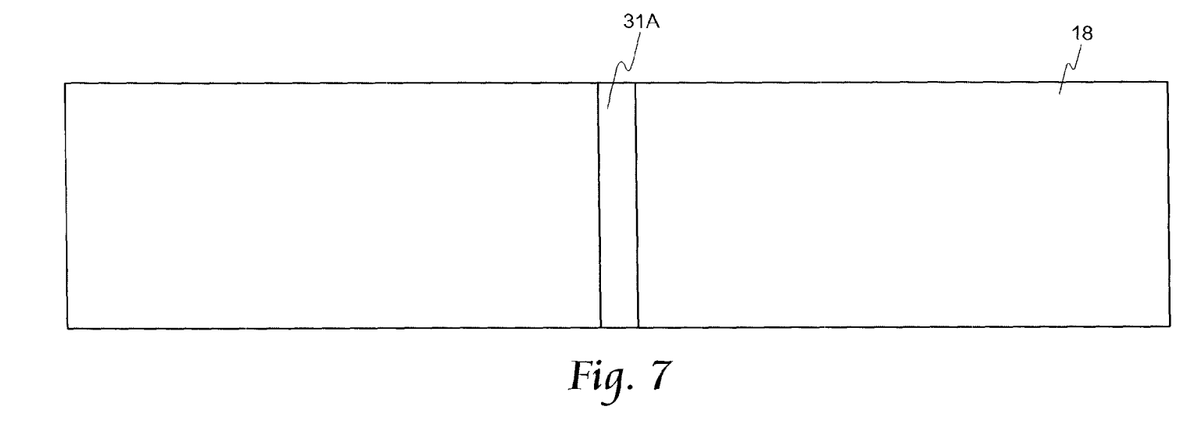
FIG. 7 is a top view of one embodiment of the channel formed in FIG. 3.
Figure 8:
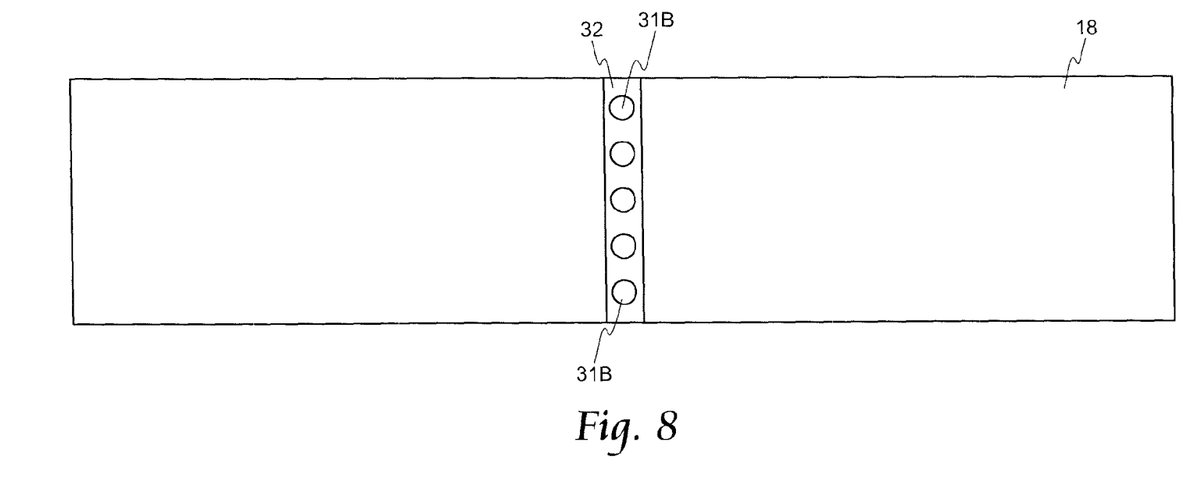
FIG. 8 is a top view of another embodiment of the channel formed in FIG. 3.

The opening 31 may be formed in different manners. In accordance with one embodiment as shown in FIG. 7, the opening 31 is a continuous path 31A. The laser is used to ablate a continuous path 31A in the channel 32 to expose the metal traces 22. Alternatively, as shown in FIG. 8, the opening 31 is a non-continuous path made by forming a plurality of apertures 31B in the channel 32. The laser may be used ablate the plurality of apertures 31B in the channel 32 to form the opening 31. The apertures 31B would be formed of a depth to expose the metal traces 22 on the first surface of the insulation layer 20.

Figure 5:
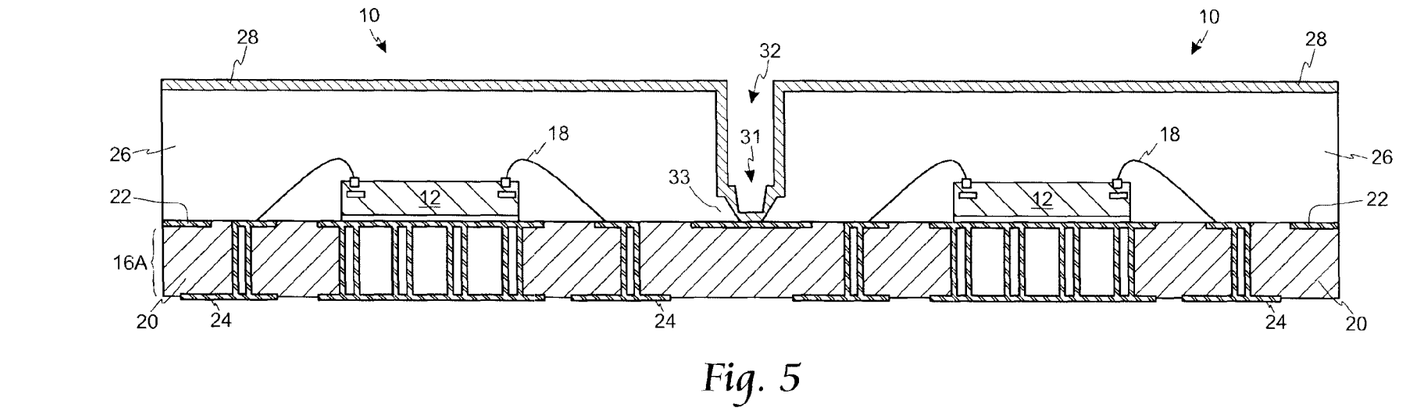
FIG. 5 is a cross-sectional view depicting a conductive material being applied.

Once portions of the mold compound 26 below the channel 32 are removed to expose the metal traces 22, a conductive material 28 is applied to the semiconductor device 10 as described in step 130 and FIG. 5. The conductive material 28 may be applied by plating, vacuum printing, vacuum deposition, insert molding, spray coating, and the like. The conductive material 28 may be Ag, Cu—Ni—Sn, Cu—Sn, Ni—Sn or the like. The listing is given as an example and should not be seen as to limit the scope of the present invention.

In Step 130, the conductive material 28 is a conformal coating. In a conformal coating, a thin layer of the conductive material 28 is applied to the top surface of the semiconductor device 10 and to the side surface of the semiconductor device 10. The conductive material 28 is applied to the side surface of the semiconductor device 10 so that the body or vertical member of the "L" shape side surface of the semiconductor device 10 and the leg or horizontal member of the "L" shape side surface of the semiconductor device 10 both have a thin layer of conductive material 28 similar in thickness to the conductive material 28 applied to the top surface of the semiconductor device 10. The conductive material 28 is applied so that the conductive material 28 will be in contact with the exposed metal traces 22 on the first surface of the insulation layer 20. Thus, the semiconductor device 10 will have a conductive material 28 that contacts grounded metal.

Figure 6:
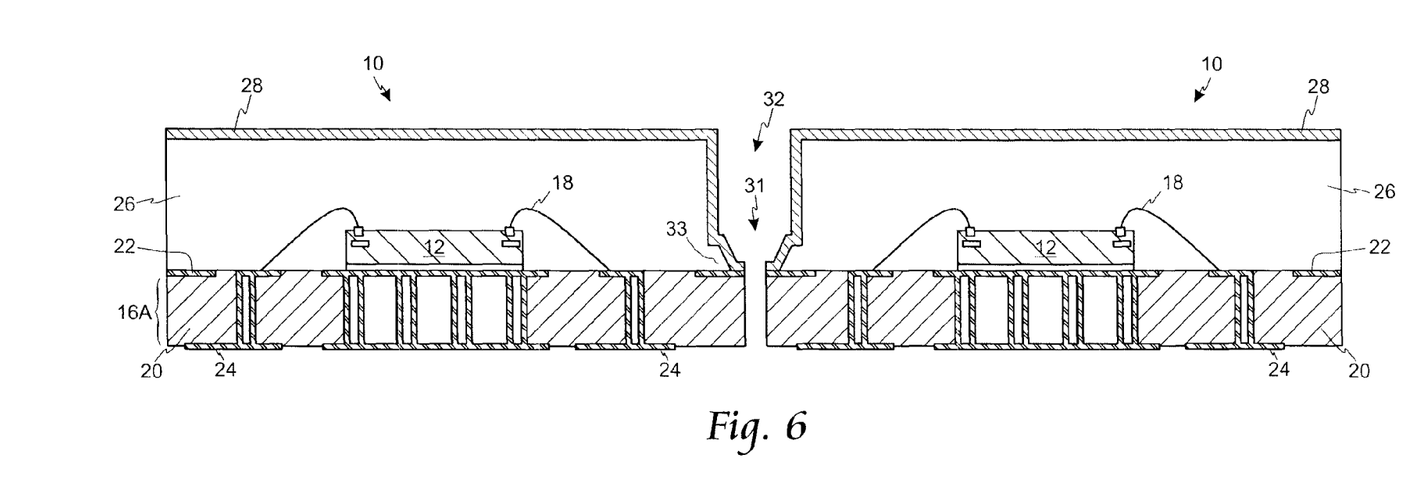
FIG. 6 is a cross-sectional view depicting singulation of the semiconductor devices.

As shown in Step 140 and FIG. 6, the substrate strip 16A is then singulated using a blade which is thinner than the blade used to form the channel 32. It should be noted that other methods may be used to singulate the substrate strip 16A without departing from the spirit and scope of the present invention. After singulation, a semiconductor device 10 is formed that will have a conductive material 28 that contacts grounded metal on four sides. Since a conformal coating is applied, each semiconductor device 10 will have "L" shaped edges formed after singulation.

Electrical contacts (not shown) may be coupled to a second surface of the substrate 16. The electrical contacts may be a plurality of solder balls, a plurality of leads, or the like. The electrical contacts may be coupled before or after singulation.

Figure 9:
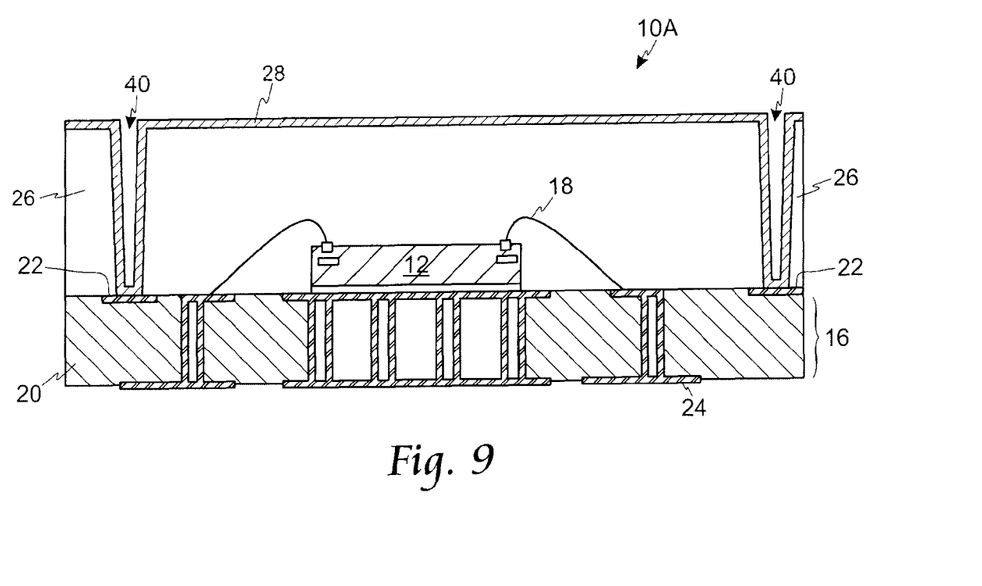
FIG. 9 is a cross-sectional view of another embodiment of the semiconductor device of the present invention.

Referring to FIG. 9, another embodiment of the semiconductor device 10A is As in the previous embodiment, the semiconductor device 10A has a die 12. The die 12 may be any type of device. An adhesive is generally used to couple the die 12 to the substrate 16. The adhesive may be an adhesive film, an epoxy, or the like. The listing of the above adhesive types should not be seen as to limit the scope of the present invention. The die 12 is electrically coupled to the substrate 16. The die 12 may be coupled to the substrate 16 through the use of wirebonds 18. Alternatively, a flip chip may be used. It should be noted that instead of a die 12, a stacked die or multi-chip module (MCM) may be used as well as a surface mounted device (SMD).

The die 12 is placed on the first surface of the substrate 16. The substrate 16 may be any one chosen from a conventional rigid PCB, a flexible PCB, and an equivalent thereof, but the kind of substrate 16 is not limited herein. The substrate 16 includes an insulation layer 20 having predetermined area and thickness. The insulation layer 20 has an approximately planar first surface and an approximately planar second surface opposing the first surface. The substrate 16 has a plurality of metal traces 22 formed on the first surface of the insulation layer 20 and a plurality of metal traces 24 formed on the second surface thereof. A soldermask is generally placed over the top surface of the metal traces 22 and 24 formed on the substrate 16. The soldermask is used to protect the metal traces 22 and 24. A mold compound 26 is used to encapsulate the semiconductor device 10A. The mold compound 26 is mainly made of non-conductive paste or film, which is coated on the top surface of the die 12 and the exposed soldermask placed over the top surface of the last layer of metal traces 22.

In this embodiment, the laser is used to ablate vias 40 into the mold compound 26. The vias 40 are formed to expose, but not cut into, the metal traces 22 on the first surface of the insulation layer 20. In general, vias 40 are formed on all four sides of the semiconductor device 10A so that one of the metal traces 22 is exposed on each side of the semiconductor device 10A.

A conductive material 28 is then applied to the semiconductor device 10A. The conductive material 28 is used to provide RF shielding for the semiconductor device 10A. The conductive material 28 may be applied by plating, vacuum printing, vacuum deposition, insert molding, spray coating, and the like. The conductive material 28 is applied to the top surface of the semiconductor device 10A and to the side surfaces of the vias 40. The conductive material 28 is applied so that the conductive material 28 will be in contact with the exposed metal traces 22. Thus, the semiconductor device 10A will have a conductive material 28 that contacts grounded metal. If all four sides of the semiconductor device 10A expose one of the metal traces 22, the conductive material 28 will contact ground metal on all four sides of the semiconductor device 10A through the vias 40. A passivation layer may then be applied over the conductive material 28. Electrical contacts (not shown) may be coupled to a second surface of the substrate 16. The electrical contacts may be a plurality of solder balls, a plurality of leads, or the like. The electrical contacts may be coupled before or after singulation.

Figure 10:
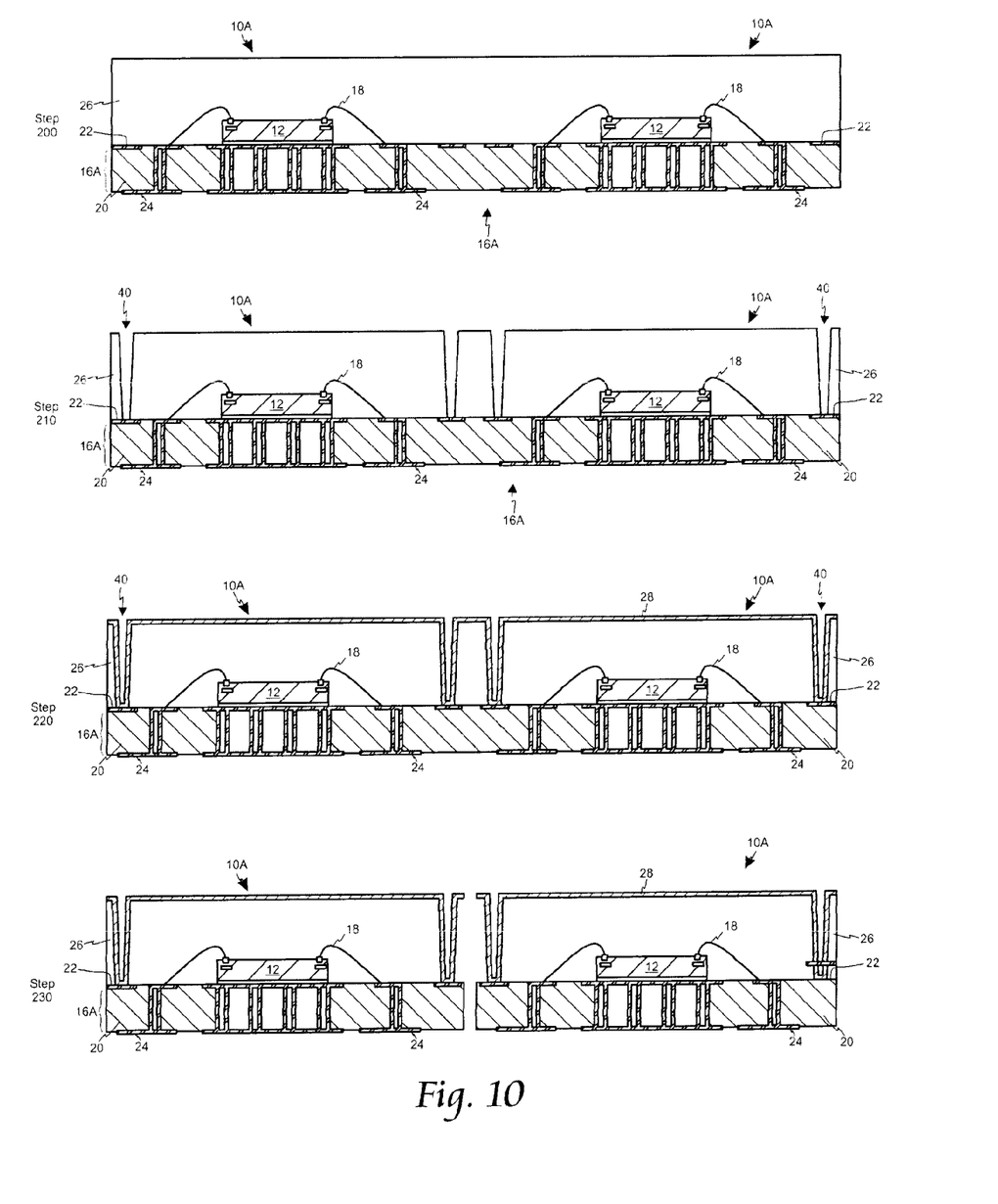
FIG. 10 shows cross-sectional views of a process for forming the semiconductor device depicted in FIG. 9.

Referring now to FIG. 10 a method of forming the semiconductor device 10A will be described. The semiconductor device 10A is assembled in strip fashion as shown in Step 200. The substrate strip 16A is segmented into a plurality of rows and columns to form individual semiconductor devices 10A. While FIG. 10 only shows a two dimensional view and a substrate strip 16A having only two rows, the substrate strip 16A may have a plurality of rows and columns to form individual semiconductor devices 10A. The substrate strip 16A will be a fully manufactured substrate strip 16A. Each segmented section of the substrate strip 16A will include an insulation layer 20 having predetermined area and thickness. A plurality of metal traces 22 are formed on the first surface of the insulation layer 20 and a plurality of metal layers 24 formed on the second surface thereof. A soldermask may then be placed over the top surface of the last metal traces 22 and 24 formed on the substrate 16.

As shown in Step 200, a die 12 is coupled to a first surface of a substrate 16 for each module on the substrate strip 16A.

Some type of adhesive is generally used to couple the die 12 to the substrate 16. The die 12 is then electrically coupled to the substrate 16. The die 12 may be coupled to the substrate 16 through the use of wirebonds 18. Alternatively, a flip chip or other methods may be used. Once each die 12 is coupled to a first surface of a substrate 16 for each module on the substrate strip 11, a mold compound 26 is then used to encapsulate the semiconductor device 10.

Next, as shown in Step 210, a laser is used to ablate vias 40 into the mold compound 26. The vias 40 are tapered shape. The vias 40 are formed to expose, but not cut into, the metal traces 22 on the first surface of the insulation layer 20. In general, vias 40 are formed on all four sides of the semiconductor device 10A so that one of the metal traces 22 is exposed on each side of the semiconductor device 10.

Once the vias 40 are formed to expose the metal traces 22, a conductive material 28 is applied to the semiconductor device 10 as shown in step 220. The conductive material 28 may be applied by plating, vacuum printing, vacuum deposition, insert molding, spray coating, and the like. In Step 220, the conductive material 28 is a conformal coating. In a conformal coating, a thin layer of the conductive material 28 is applied to the top surface of the semiconductor device 10 and to the side and bottom surfaces of the vias 40, the bottom surface of the vias 40 being the metal traces 22. The conductive material 28 is applied so that the side and bottom surfaces of the vias 40 have a thin layer of conductive material 28 similar in thickness to the conductive material 28 applied to the top surface of the semiconductor device 10. The conductive material 28 is applied so that the conductive material 28 will be in contact with the exposed metal traces 22 on the first surface of the insulation layer 20. Thus, the semiconductor device 10 will have a conductive material 28 that contacts grounded metal.

As shown in Step 230, the substrate strip 16A is then singulated. A saw, laser or the like may be used to singulate the substrate strip 16A. It should be noted that other methods may be used to singulate the substrate strip 16A without departing from the spirit and scope of the present invention. After singulation, a semiconductor device 10 is formed that will have a conductive material 28 that contacts grounded metal on four sides.

Electrical contacts (not shown) may be coupled to a second surface of the substrate 16. The electrical contacts may be a plurality of solder balls, a plurality of leads, or the like. The electrical contacts may be coupled before or after singulation.

Figure 11:
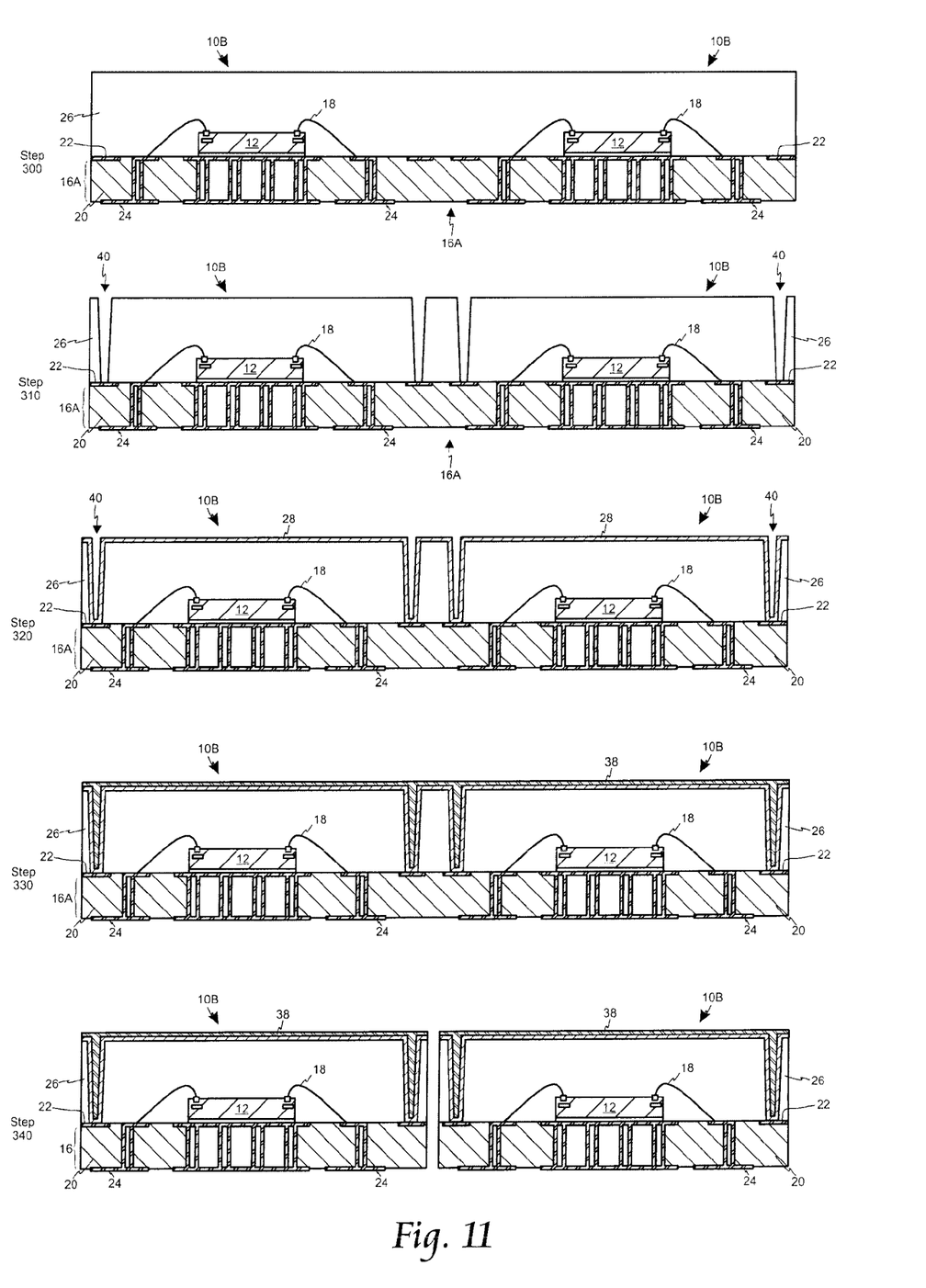
FIG. 11 shows cross-sectional views of another process for forming the semiconductor device depicted in FIG. 9.

Referring to FIG. 11, another method of forming the semiconductor device 10B will be described. The semiconductor device 10A is assembled in strip fashion as shown in Step 300. The substrate strip 16B is segmented into a plurality of rows and columns to form individual semiconductor devices 10A. While FIG. 11 only shows a two dimensional view and a substrate strip 16A having only two rows, the substrate strip 16A may have a plurality of rows and columns to form individual semiconductor devices 10A. The substrate strip 16A will be a fully manufactured substrate strip 16A. Each segmented section of the substrate strip 16A will include an insulation layer 20 having predetermined area and thickness. A plurality of metal traces 22 are formed on the first surface of the insulation layer 20 and a plurality of metal layers 24 formed on the second surface thereof. A soldermask may then be placed over the top surface of the last metal traces 22 and 24 formed on the substrate 16.

As shown in Step 300, a die 12 is coupled to a first surface of a substrate 16 for each module on the substrate strip 16A. Some type of adhesive is generally used to couple the die 12 to the substrate 16. The die 12 is then electrically coupled to the substrate 16. The die 12 may be coupled to the substrate 16 through the use of wirebonds 18. Alternatively, a flip chip or other methods may be used. Once each die 12 is coupled to a first surface of a substrate 16 for each module on the substrate strip 11, a mold compound 26 is then used to encapsulate the semiconductor device 10B.

Next, as shown in Step 310, a laser is used to ablate vias 40 into the mold compound 26. The vias 40 are formed to expose, but not cut into, the metal traces 22 on the first surface of the insulation layer 20. In general, vias 40 are formed on all four sides of the semiconductor device 10B so that one of the metal traces 22 is exposed on each side of the semiconductor device 10B.

Once the vias 40 are formed to expose the metal traces 22, a conductive material 28 is applied to the semiconductor device 10 as described in step 320. The conductive material 28 may be applied by plating, vacuum printing, vacuum deposition, insert molding, spray coating, and the like. In Step 320, the conductive material 28 is a conformal coating. In a conformal coating, a thin layer of the conductive material 28 is applied to the top surface of the semiconductor device 10 and to the side and bottom surfaces of the vias 40, the bottom surface of the vias 40 being the metal traces 22. The conductive material 28 is applied so that the side and bottom surfaces of the vias 40 have a thin layer of conductive material 28 similar in thickness to the conductive material 28 applied to the top surface of the semiconductor device 10B. The conductive material 28 is applied so that the conductive material 28 will be in contact with the exposed metal traces 22 on the first surface of the insulation layer 20. Thus, the semiconductor device 10B will have a conductive material 28 that contacts grounded metal.

After the conductive material 28 is applied, a passivation layer 38 is applied as shown in step 330. The passivation layer 38 is applied to the top surface of the conductive material 28. The passivation layer 38 will further fill-in the vias 40.

As shown in Step 340, the substrate strip 16A is then singulated. A saw, laser or the like may be used to singulate the substrate strip 16A. It should be noted that other methods may be used to singulate the substrate strip 16A without departing from the spirit and scope of the present invention. After singulation, a semiconductor device 10B is formed that will have a conductive material 28 that contacts grounded metal on four sides.

Electrical contacts (not shown) may be coupled to a second surface of the substrate 16. The electrical contacts may be a plurality of solder balls, a plurality of leads, or the like. The electrical contacts may be coupled before or after singulation.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
   a substrate comprising at least one dielectric layer and at least one metal layer on a first surface of the substrate;
   a die attached to the first surface of the substrate;
   a mold compound encapsulating the die and partially encapsulating the first surface of the substrate, the mold compound having a protrusion formed below a top surface of the mold compound, an angled surface of the mold compound extending from the protrusion, the at least one metal layer exposed along a distal end of the angled surface; and a conductive material that covers the mold compound, including the protrusion, and contacts the at least one metal layer exposed.

2. The semiconductor device in accordance with claim 1 wherein the protrusion is a ledge formed on at least one side surface of the substrate below the top surface of the mold compound.

3. The semiconductor device in accordance with claim 2 wherein the ledge extends approximately a length of the at least one side surface of the substrate.

4. The semiconductor device in accordance with claim 2 wherein the conductive material conformally covers the mold compound, including the protrusion, and contacts the at least one metal layer.

5. The semiconductor device in accordance with claim 4 wherein the conductive material completely covers the mold compound, including the protrusion, and contacts the at least one metal layer such that the conductive material being substantially planar to a side surface and the horizontal surface of the ledge.

6. The semiconductor device in accordance with claim 2 further comprising a plurality of vias formed in the mold compound, the plurality of vias forming a plurality of ledges, the at least one metal layer exposed on horizontal surfaces of the plurality of ledges.

7. The semiconductor device in accordance with claim 1 further comprising at least one via formed in the substrate, the via coupled to the at least one metal layer exposed on the horizontal surface of the substrate, the conductive material coupled directly to at least one metal layer exposed through the at least one via.

8. The semiconductor device in accordance with claim 7 wherein the conductive material conformally covers the mold compound, including the protrusion, and contacts the at least one metal layer.

9. The semiconductor device in accordance with claim 7 further comprising a passivation layer applied to the conductive material.

10. A semiconductor device comprising:
   a substrate having at least one metal layer on a first surface of the substrate;
   a die attached to the first surface of the substrate;
   a mold compound encapsulating the die and partially encapsulating the first surface of the substrate, the mold compound having a ridge formed below a top surface of the substrate, a surface of the mold compound extending from the ridge and exposing the at least one metal layer on the first surface of the substrate; and
   a conductive material that covers the mold compound, including the ridge, and contacts the at least one metal layer.

11. The semiconductor device in accordance with claim 10 wherein the ridge comprises:
   an L-shaped ledge formed below the top surface of the mold compound and on at least one side surface of the mold compound; and
   an angled surface running away from a horizontal member of the L-shaped ledge, the at least one metal layer exposed at a bottom of the angled surface.

12. The semiconductor device in accordance with claim 10 wherein the ridge extends approximately a length of the at least one side surface of the substrate.

13. The semiconductor device in accordance with claim 10 wherein the conductive material conformally covers the mold compound, including the ridge, and contacts the at least one metal layer.

14. The semiconductor device in accordance with claim 13 wherein the conductive material completely covers the mold compound, including the ridge, and contacts the at least one metal layer such that the conductive material being substantially planar to a side surface and the horizontal surface of the ledge.

15. The semiconductor device in accordance with claim 10 further comprising a plurality of vias formed in the mold compound, the plurality of vias forming a plurality of ridges, the at least one metal layer exposed on a bottom area of the plurality of ridges.

16. The semiconductor device in accordance with claim 10 further comprising at least one via formed in the substrate, the via coupled to the at least one metal layer exposed on the first surface of the substrate, the conductive material coupled directly to at least one metal layer exposed through the at least one via.

17. The semiconductor device in accordance with claim 16 wherein the conductive material conformally covers the mold compound, including the ridge, and contacts the at least one metal layer.

18. The semiconductor device in accordance with claim 16 further comprising a passivation layer applied to the conductive material.

19. A semiconductor device comprising:
   a substrate having at least one metal layer on a first surface of the substrate;
   a die attached to the first surface of the substrate;
   a mold compound encapsulating the die and partially encapsulating the first surface of the substrate, the mold compound having a ridge, wherein the ridge comprises:
      an L-shaped ledge formed on at least one side surface of the mold compound; and
      an angled surface running away from a horizontal member of the L-shaped ledge, the at least one metal layer exposed at a bottom of the angled surface; and
   a conductive material that covers the mold compound, including the ridge, and contacts the at least one metal layer.

20. The semiconductor device in accordance with claim 19 further comprising a plurality of vias formed in the mold compound, the plurality of vias forming a plurality of ridges, the at least one metal layer exposed on a bottom area of the plurality of ridges.

* * * * *